US010665906B2

(12) United States Patent
Hsu et al.

(10) Patent No.: US 10,665,906 B2
(45) Date of Patent: May 26, 2020

(54) BATTERY CELL FORMATION DEVICE AND PROBE SUPPORTING STRUCTURE THEREOF

(71) Applicant: CHROMA ATE INC., Taoyuan (TW)

(72) Inventors: Hsu-Chang Hsu, Taoyuan (TW); Kuo-Yen Hsu, Taoyuan (TW); Kuan-Chen Chen, Taoyuan (TW); Chuan-Tse Lin, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 156 days.

(21) Appl. No.: 16/108,081

(22) Filed: Aug. 21, 2018

(65) Prior Publication Data
US 2019/0067759 A1    Feb. 28, 2019

(30) Foreign Application Priority Data
Aug. 23, 2017 (TW) .............................. 106128533 A

(51) Int. Cl.
*H01M 10/48* (2006.01)
*H01M 10/42* (2006.01)
*G01R 31/36* (2020.01)
*G01R 31/385* (2019.01)
*H01M 10/44* (2006.01)
*H01M 2/10* (2006.01)

(52) U.S. Cl.
CPC ........ *H01M 10/482* (2013.01); *G01R 31/385* (2019.01); *H01M 2/1016* (2013.01); *H01M 10/4207* (2013.01); *H01M 10/4285* (2013.01); *H01M 10/446* (2013.01); *H01M 10/484* (2013.01)

(58) Field of Classification Search
CPC combination set(s) only.
See application file for complete search history.

(56) References Cited

U.S. PATENT DOCUMENTS

| 9,472,797 | B2* | 10/2016 | Han | H01M 2/1005 |
|---|---|---|---|---|
| 2011/0250477 | A1* | 10/2011 | Yoshida | B60L 50/71 429/90 |
| 2012/0177970 | A1* | 7/2012 | Marchio | H01M 2/0237 429/120 |
| 2012/0328919 | A1* | 12/2012 | Laderer | H01M 10/486 429/90 |
| 2015/0125727 | A1* | 5/2015 | Lui | H01M 2/206 429/90 |
| 2015/0214583 | A1* | 7/2015 | Lim | H01M 10/486 429/90 |
| 2016/0126601 | A1* | 5/2016 | Ichikawa | H02J 7/0047 374/152 |
| 2016/0204481 | A1* | 7/2016 | Ryu | H01M 10/486 429/7 |
| 2017/0194771 | A1* | 7/2017 | Aoki | H01M 10/60 |
| 2017/0271642 | A1* | 9/2017 | Groshert | H01M 2/206 |
| 2017/0343615 | A1* | 11/2017 | Lee | H01M 2/20 |
| 2018/0076429 | A1* | 3/2018 | Shoji | H01M 2/1077 |
| 2018/0131047 | A1* | 5/2018 | Zhao | H01M 2/206 |
| 2018/0151859 | A1* | 5/2018 | Aizawa | H01M 2/206 |

* cited by examiner

*Primary Examiner* — Kaity V Chandler
(74) *Attorney, Agent, or Firm* — Maschoff Brennan

(57) ABSTRACT

A probe supporting structure, configured to support probe for testing battery cell, includes a base and at least two supporting members. The supporting members are detachably disposed on the base with an adjustable distance between the supporting members. The supporting members are arranged in parallel manner.

14 Claims, 6 Drawing Sheets

BATTERY CELL FORMATION DEVICE AND PROBE SUPPORTING STRUCTURE THEREOF

CROSS-REFERENCE TO RELATED APPLICATIONS

This non-provisional application claims priority under 35 U.S.C. § 119(a) on Patent Application No(s). 106128533 filed in Taiwan, R.O.C. on Aug. 23, 2017, the entire contents of which are hereby incorporated by reference.

TECHNICAL FIELD

The present disclosure provides a battery cell formation device and a probe supporting structure, more particularly to a probe supporting structure including detachable supporting members and a battery cell formation device including the probe supporting structure.

BACKGROUND

A battery is a device including one or more electrochemical cells to convert chemical energy into electrical energy. Generally, an electrochemical cell of the battery includes a positive electrode and a negative electrode which are cooperated with an electrolyte producing an electrically conducting solution. When the electrodes of the cell are connected to an external circuit, the chemical energy is converted into electrical energy. However, after the manufacture of electrochemical cells, the electrodes should be activated to optimize the physical and chemical properties, such as the capabilities of self discharge and energy storage. In a cell formation process, the electrochemical cell is activated by repeat charge and discharge.

SUMMARY

According to one aspect of the disclosure, a probe supporting structure, configured to support probe for testing battery cell, includes a base and at least two supporting members. The supporting members are detachably disposed on the base with an adjustable distance between the supporting members. The supporting members are arranged in parallel manner.

According to another aspect of the disclosure, a probe supporting structure, configured to support probe for testing battery cell, includes a base, at least two supporting members and at least one partitioning member. The supporting members are detachably disposed on the base and arranged in parallel manner. The partitioning member is located between the supporting members.

According to still another aspect of the disclosure, a battery cell formation device includes a tray, at least two probes and one of the aforementioned probe supporting structures. The tray has a surface for supporting battery cell. The probes are disposed on the two supporting members of the probe supporting structure, respectively.

BRIEF DESCRIPTION OF THE DRAWINGS

The present invention will become more understood from the detailed description given hereinbelow and the accompanying drawings which are given by way of illustration only and thus are not limitative of the present invention and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1A:
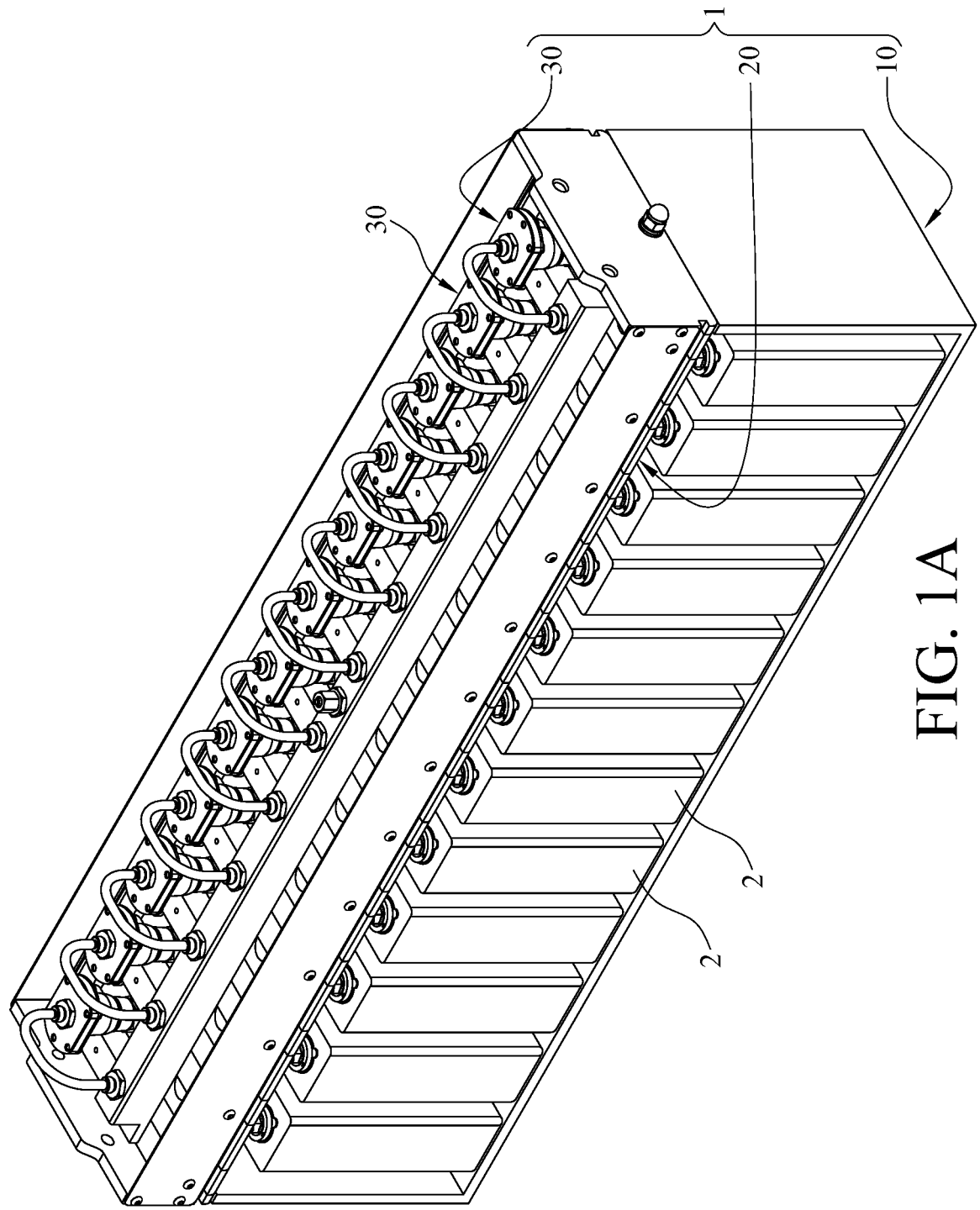
FIG. 1A is a perspective view of a battery cell formation device according to one embodiment of the present disclosure.
Figure 1B:
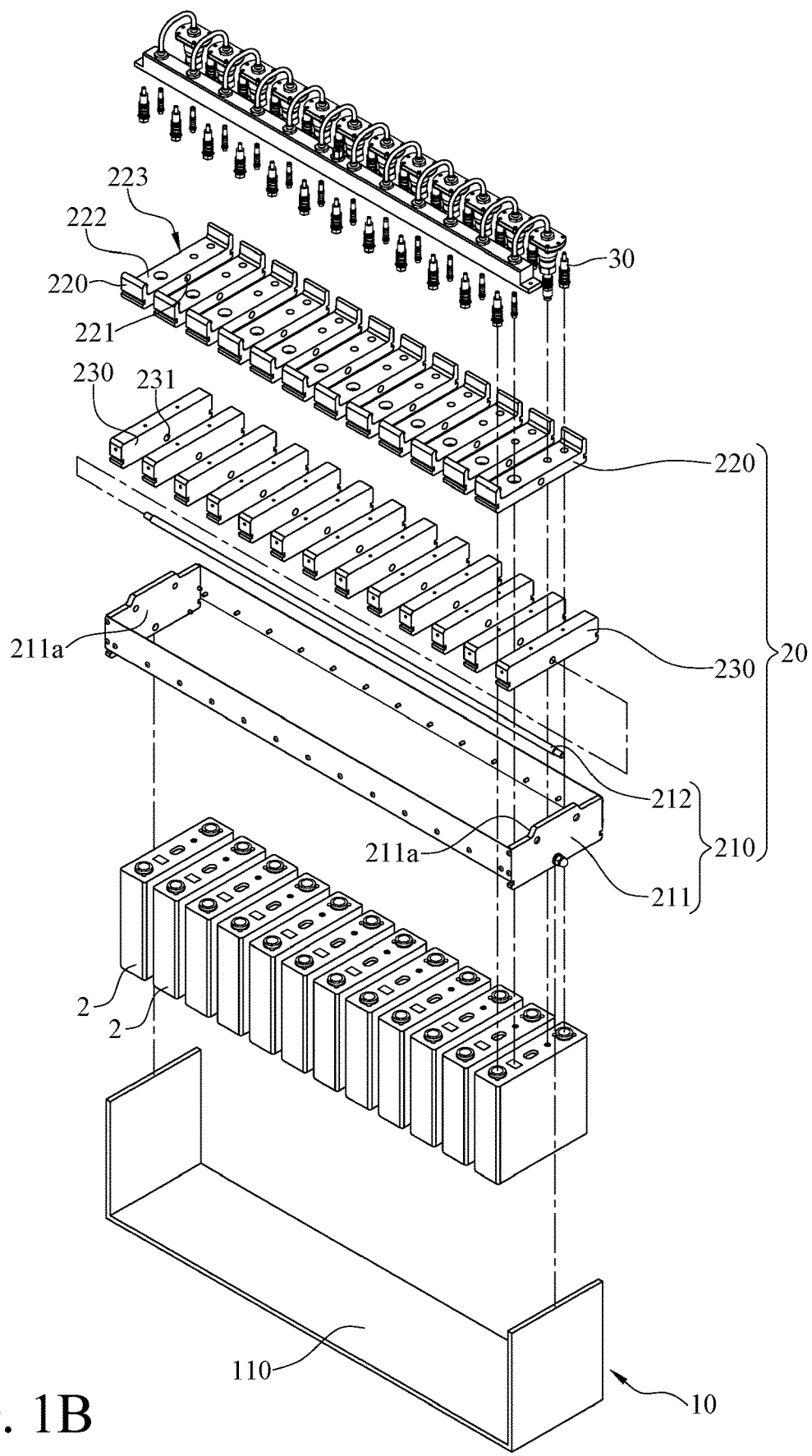
FIG. 1B is an exploded view of the battery cell formation device in FIG. 1A.
Figure 1C:
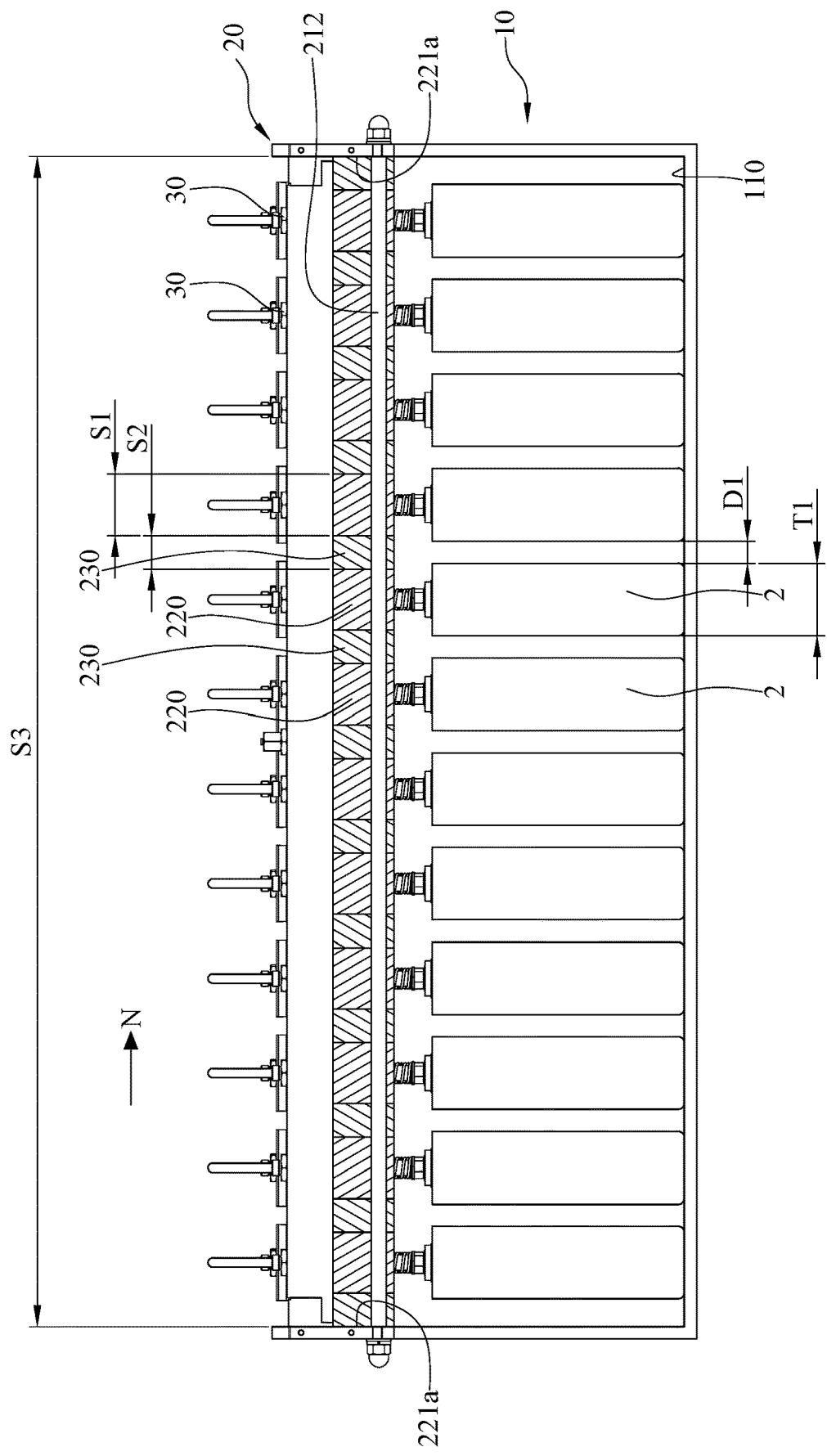
FIG. 1C is a side view of the battery cell formation device in FIG. 1A.

Please refer to FIG. 1A to FIG. 1C. FIG. 1A is a perspective view of a battery cell formation device according to one embodiment of the present disclosure. FIG. 1B is an exploded view of the battery cell formation device in FIG. 1A. FIG. 1C is a side view of the battery cell formation device in FIG. 1A. In this embodiment, a battery cell formation device 1 includes a tray 10, a probe supporting structure 20 and multiple probes 30. It is worth noting that the number of the probes 30 in the present disclosure is not limited by the above.

The tray 10 is, for example but not limited to, a plastic container. A surface 110 at the bottom of the tray 10 has multiple grooves (not shown in the drawings). Multiple battery cells 2, which are ready for formation process, are positioned in the grooves and supported by the surface 110.

The probe supporting structure 20 includes a base 210, multiple supporting members 220 and multiple partitioning members 230. The base 210 includes a frame 211 and a rod 212. The frame 211 is disposed on the tray 10, and two inner surfaces 211a of the frame 211 face each other. The rod 212 is disposed on the frame 211, and the rod 212 extends from one inner surface 211a to the other inner surface 211a along a normal direction N of the inner surface 211a. In this embodiment, opposite ends of the rod 212 are fixed to the two inner surfaces 211a, respectively.

The number of the supporting members 220 may be determined according to the number of the battery cells 2. In FIG. 1C, the number of the supporting members 220 is equal to the number of the battery cells 2. Each of the supporting members 220 has a first through hole 221. The rod 212 passes through first through holes 221, such that the supporting members 220 are disposed on the base 210. Each of the partitioning members 230 has a second through hole 231. The rod 212 passes through the second through holes 231, such that the partitioning members 230 are disposed on the base 210. In this embodiment, both the supporting members 220 and the partitioning members 230 are movably disposed on the rod 212 of the base 210 via the rod 212, but the present disclosure is not limited thereto. In some embodiments, the base of the probe supporting structure does not include the rod, and both the supporting members and the partitioning members are movably disposed on two slots at the inner side of the frame.

As shown in FIG. 1A and FIG. 1C, each battery cell 2 has a thickness T1, and there is a distance D1 between two adjacent battery cells 2. The supporting members 220 and the partitioning members 230 are arranged in parallel and alternate manners between the two inner surfaces 211a. In this embodiment, one partitioning member 230 is located between two of the supporting members 220 adjacent to each other. Each supporting member 220 has a thickness S1, and each partitioning member 230 has a thickness S2. A distance between two adjacent supporting members 220 is equal to the thickness S2 of the partitioning member 230. In this embodiment, a sum of thicknesses of the supporting members 220 and thicknesses of the partitioning members 230 is equal to a distance S3 between the two inner surfaces 211a (that is, S3=[the number of supporting members 220]× S1+[the number of partitioning members 230]×S2). Therefore, the supporting members 220 and the partitioning members 230 are tightly arranged in a space surrounded by the frame 211 so as to be favorable for preventing any irregular arrangement. Moreover, each partitioning member 230 is screwed to the frame 211 of the base 210 in this embodiment, such that it is favorable for unexpected shift in positions of the supporting members 220 due to a manufacturing tolerance of the partitioning member 230.

The probes 30 are, for example but not limited to, pogo pins or temperature sensors which are disposed on the supporting members 220, respectively. In detail, each of the supporting members 220 has a top surface 222, and the top surface 222 is recessed so as to define an accommodation space 223. The probes 30 are accommodated in the accommodation spaces 223, and each probe 30 passes through one of the holes on the top surface 222 so as to contact a positive electrode, a negative electrode or a metal pad of the battery cell 2. Compared to a supporting member without a recess for accommodating probe, the accommodation space 223 is favorable for accommodating the probe 30 so as to prevent an overly large height of the battery cell formation device 1.

In this embodiment, the battery cell formation device 1 further includes additional elements such as pipes for negative pressure ventilation, pipes for inputting electrolyte and suction nozzles. Furthermore, it is worth noting that both the size of the supporting members 220 and the size of the partitioning members 230 depicted in FIG. 1A to FIG. 1C are not limited by the above.

Figure 2:
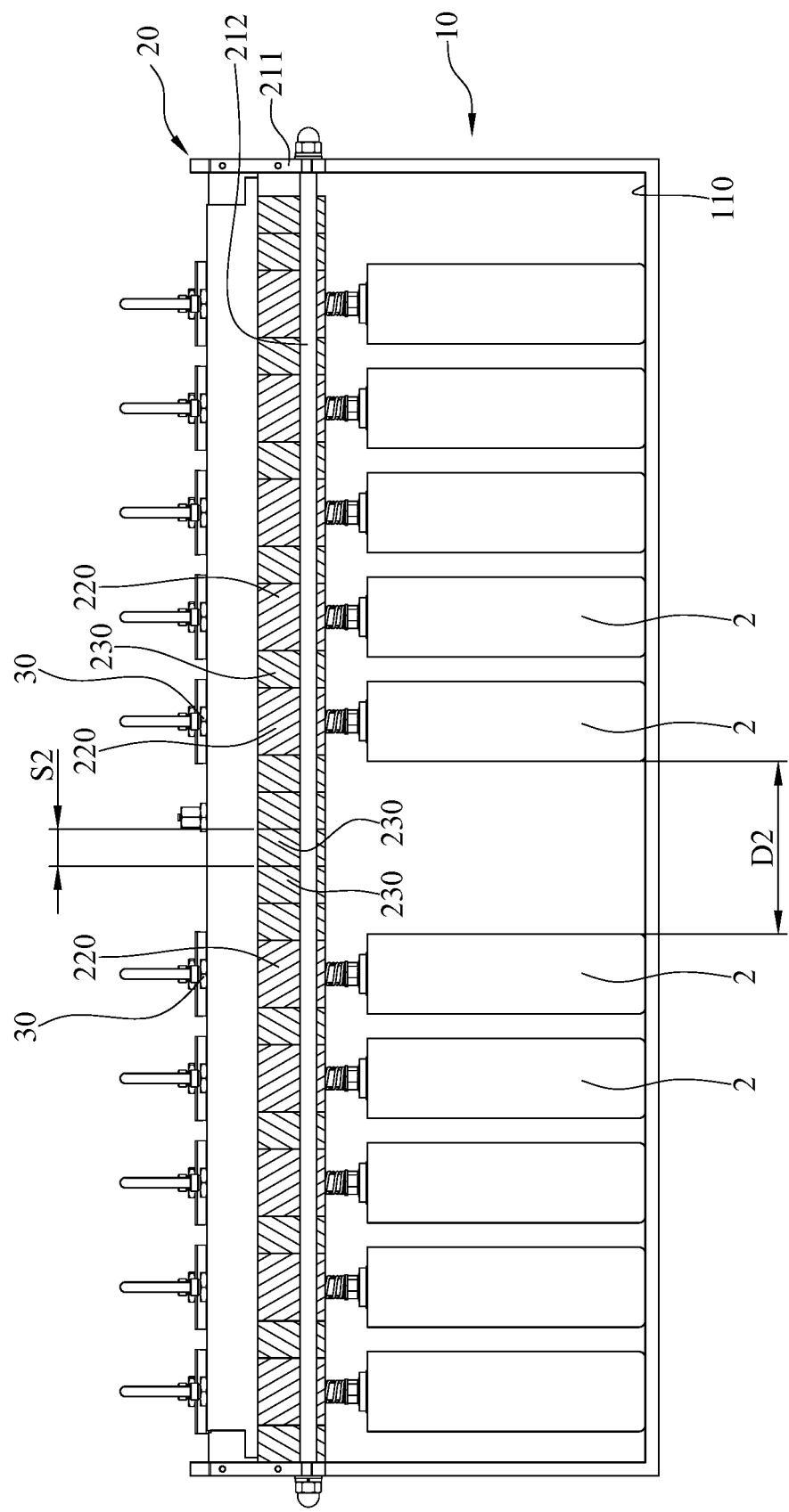
FIG. 2 is a side view of the battery cell formation device in FIG. 1A, with different distances between two adjacent battery cells.
Figure 3:
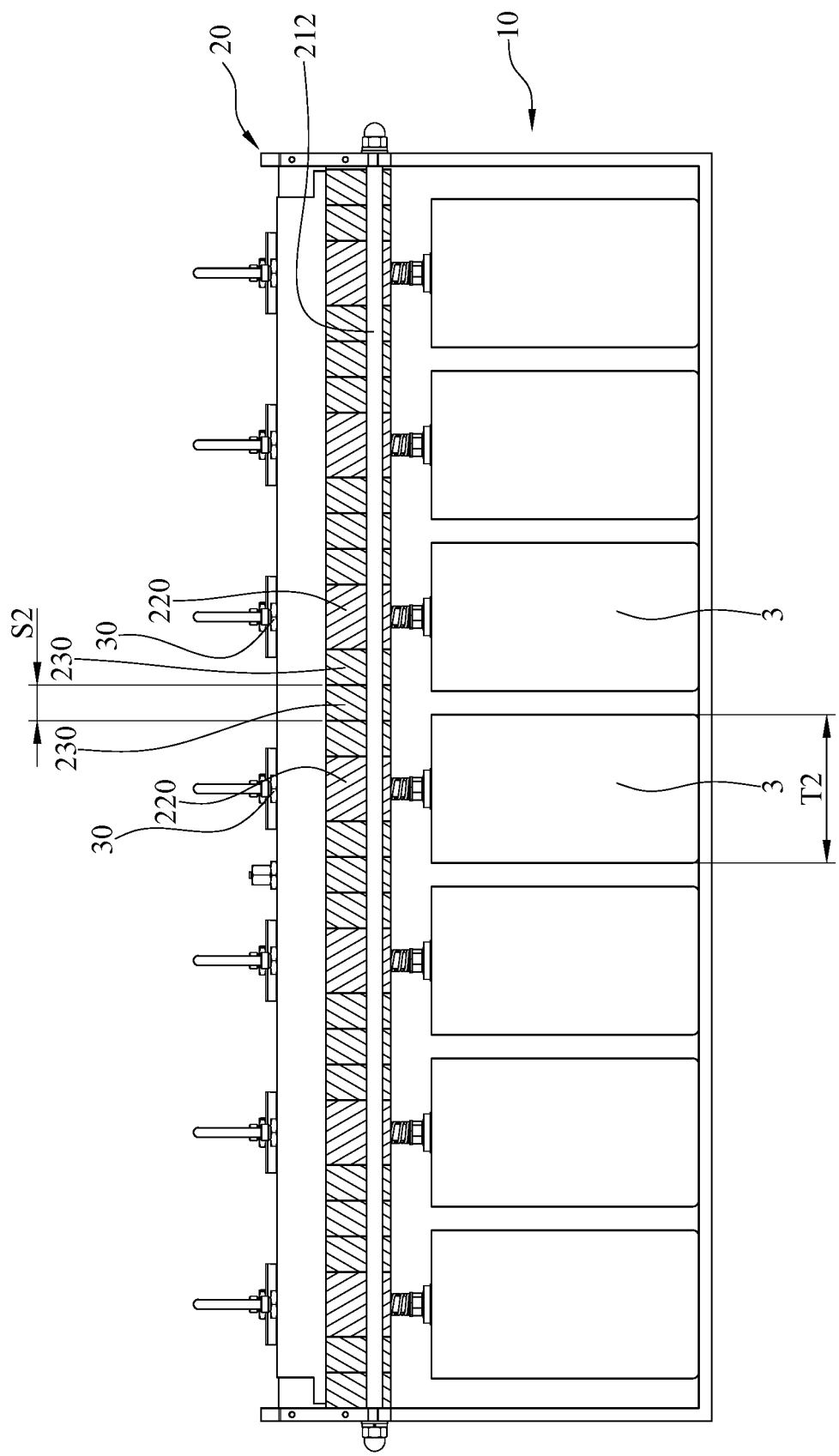
FIG. 3 and FIG. 4 are side views of the battery cell formation device in FIG. 1A, with different specifications of the battery cells.
Figure 4:
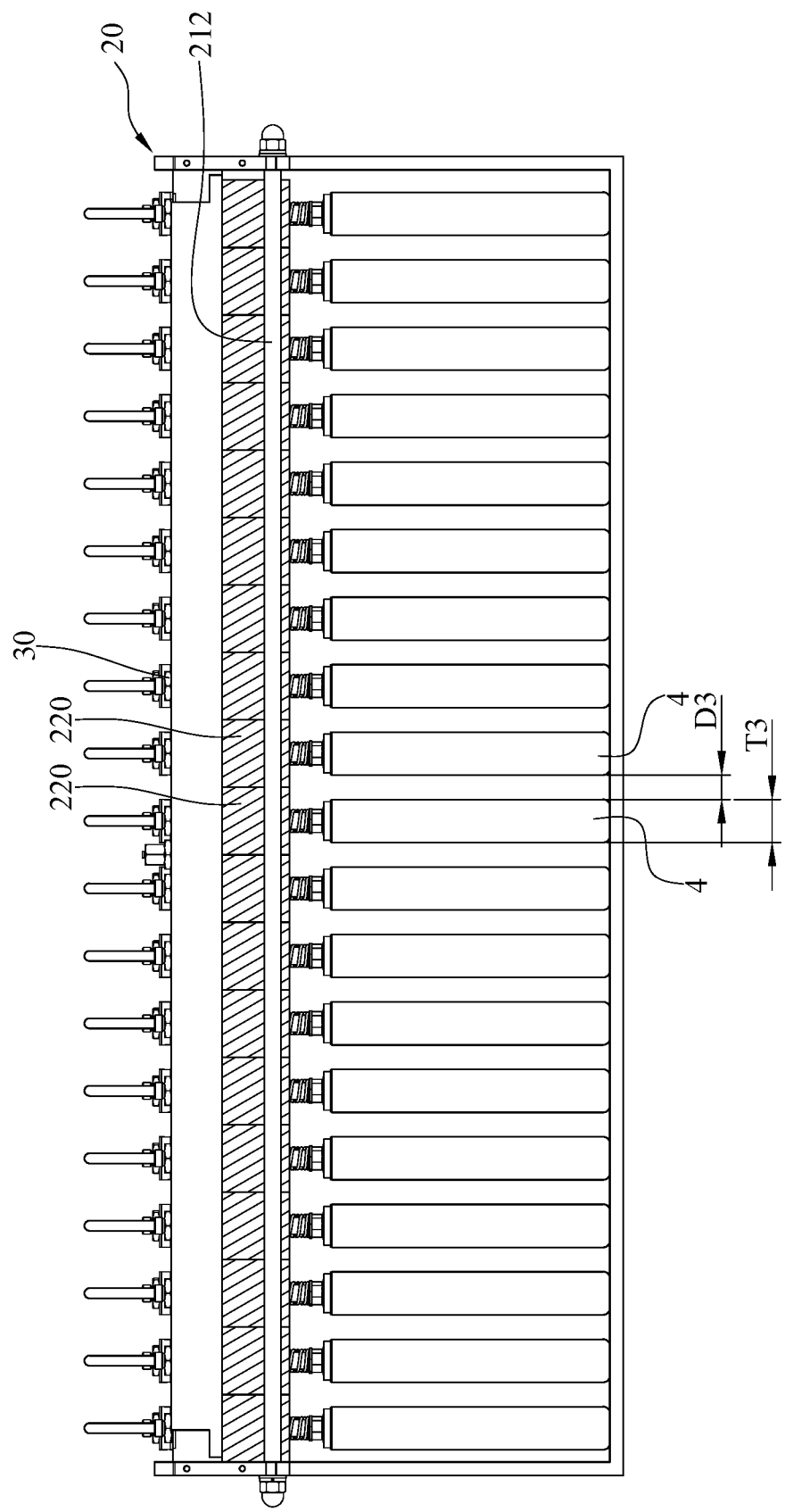

An arrangement of the supporting members 220 and the partitioning members 230 of the probe supporting structure 20 is depicted in FIG. 1C, but the present disclosure is not limited thereto. When the specification of the battery cell or the distance between two adjacent battery cells is changed, the numbers of both the supporting members 220 and the partitioning members 230 or the arrangement of the supporting members 220 and the partitioning members 230 is adjustable to meet the aforementioned changes. FIG. 2 is a side view of the battery cell formation device in FIG. 1A, with different distances between two adjacent battery cells. FIG. 3 and FIG. 4 are side views of the battery cell formation device in FIG. 1A, with different specifications of the battery cells.

As shown in FIG. 2, multiple battery cells 2 are positioned on the surface 110 of the tray 10. A distance D2 between one of the pairs of the battery cells 2 is larger than the distance D1 between every adjacent battery cell 2 in FIG. 1C; thus, the arrangement of the supporting members 220 in FIG. 1C is incapable of making the probes 30 contact the electrodes or the metal pads of the pair of the battery cells 2. In order to accomplish the battery cell formation process, it is required to change the arrangement of the supporting members 220 and the partitioning members 230.

Firstly, the supporting members 220 and the partitioning members 230 are detached from the rod 212. Then, the supporting members 220 and the partitioning members 230 are rearranged so as to adjust the distance between a pair of the supporting members 220. The supporting members 220 and the partitioning members 230, with a new arrangement, are disposed on the rod 212. A kind of rearrangement is to change the number of partitioning members 230 between a pair of two adjacent supporting members 220. In this embodiment, the distance is adjusted by putting more partitioning members 230 between the pair of the supporting members 220. The adjusted distance is favorable for the probes 30, which are disposed on the pair of the supporting members 220, contacting the aforementioned pair of the battery cells 2 having the distance D2 therebetween. In FIG. 2, a total of five partitioning members 230 is disposed between the pair of the supporting members 220, such that the distance between the pair of the supporting members 220 is five times larger than the thickness S2 of the partitioning member 230, and the distance between the other pairs of the supporting members 220 is equal to the thickness S2 of the partitioning member 230.

As shown in FIG. 3, the battery cells 2 are removed from the tray 10, and multiple battery cells 3 are positioned on the tray 10. The battery cell 3 has a different size than the battery cell 2. In detail, each battery cell 3 has a thickness T2 larger than the thickness T1 of the battery cell 2 in FIG. 1C. Thus, the arrangement of the supporting members 220 and the partitioning members 230 in FIG. 1C is incapable of making the probes 30 contact the electrodes or the metal pads of the pair of the battery cells 3. In such a case, the supporting members 220 and the partitioning members 230 are detached from the rod 212 again. A user is able to detach the supporting members 220 and the partitioning members 230, and then rearrange the supporting members 220 and the partitioning members 230 to adjust the distance between two adjacent supporting members 220. The adjusted distance is favorable for the probes 30, which are disposed on the supporting members 220, contacting the electrodes or the metal pads of the battery cells 3. In FIG. 3, a total of three partitioning members 230 is disposed between each pair of the supporting members 220, such that the distance between every adjacent supporting member 220 is three times larger than the thickness S2 of the partitioning member 230.

As shown in FIG. 4, multiple battery cells 4 are positioned on the tray 10, and each battery cell 4 has a thickness T3 smaller than both the thickness T1 of the battery cell 2 in FIG. 1C and the thickness T2 of the battery cell 3 in FIG. 2. There is a distance D3 between two adjacent battery cells 4, and the distance D3 is smaller than the distance D1 in FIG. 1C. In such a case, the supporting members 220 and the partitioning members 230 are detached from the rod 212 again. The user is able to detach the supporting members 220 and arrange the supporting members 220 to make the supporting members 220 close to each other, and thus it is favorable for the probes 30, which are disposed on the supporting members 220, contacting the electrodes or the metal pads of the battery cells 4. In FIG. 4, the supporting members 220 are arranged tightly, such that a gap between two adjacent supporting members 220 is smaller than the thickness S2. Accordingly, it is unable to dispose any partitioning member 230 between two adjacent supporting members 220. The supporting members 220, with a new arrangement, are disposed on the rod 212 with all partitioning members 230 removed.

According to the disclosure, the probe supporting structure of the battery cell formation device includes multiple supporting members which are detachably disposed on the base with an adjustable distance between two adjacent supporting members. The distance between two adjacent supporting members is adjustable to meet the changes of the battery cells in number and arrangement. Once the number or the specification of battery cell is changed, it is unnecessary to replace the present probe supporting structure with another probe supporting structure having different specification. Instead, a user is able to adjust the positions of the supporting members to make the probes, which are disposed on the supporting members, contacting the electrodes or the metal pads of the battery cells. Therefore, the battery cell formation device is applicable to the cell formation process for battery cells having different specifications or arrangements, thereby reducing cost and enhancing compatibility.

Furthermore, in one aspect of the disclosure, the distance between two adjacent supporting members is adjusted by putting one or more partitioning member between these two supporting members. The partitioning member is favorable for eliminating the gap between the supporting members so as to maintain the distance.

The foregoing description, for the purpose of explanation, has been described with reference to specific embodiments; however, the embodiments were chosen and described in order to best explain the principles of the disclosure and its practical applications, to thereby enable others skilled in the art to best utilize the disclosure and various embodiments with various modifications as are suited to the particular use contemplated. The embodiments depicted above and the appended drawings are exemplary and are not intended to be exhaustive or to limit the scope of the disclosure to the precise forms disclosed. Modifications and variations are possible in view of the above teachings.

What is claimed is:

1. A battery cell formation device, comprising:
    a tray having a battery cell supporting surface;
    a probe supporting structure engageable with the tray, the probe supporting structure comprising:
    a base; and
    at least two supporting members detachably disposed on the base with an adjustable distance between the at least two supporting members, and the at least two supporting members being arranged in parallel; and
    at least two probes supported by the at least two supporting members, respectively.

2. The battery cell formation device according to claim 1, further comprising at least one partitioning member disposed on the base, wherein the at least one partitioning member is located between the at least two supporting members.

3. The battery cell formation device according to claim 2, wherein the at least one partitioning member is screwed to the base.

4. The battery cell formation device according to claim 2, wherein the number of the at least one partitioning member is multiple, and the partitioning members are located between the at least two supporting members.

5. The battery cell formation device according to claim 2, wherein the number of the at least two supporting members is multiple, the number of the at least one partitioning member is multiple, and the supporting members and the partitioning members are arranged in alternate manner.

6. The battery cell formation device according to claim 5, wherein two inner surfaces of the base face each other, the supporting members and the partitioning members are arranged in alternate manner along a normal direction of the two inner surfaces, and a sum of thicknesses of the supporting members and thicknesses of the partitioning members is equal to a distance between the two inner surfaces.

7. The battery cell formation device according to claim 1, wherein the base comprises a frame and a rod disposed on the frame, and the rod passes through a first through hole of each of the at least two supporting members.

8. The battery cell formation device according to claim 7, further comprising at least one partitioning member located between the at least two supporting members, wherein the rod passes through a second through hole of the at least one partitioning member.

9. The battery cell formation device according to claim 1, wherein a top surface of each of the at least two supporting members is recessed to define an accommodation space for accommodating probe.

10. A battery cell formation device, comprising:
    a tray having a battery cell supporting surface;
    a probe supporting structure engageable with the tray, the probe supporting structure comprising:
    a base;
    at least two supporting members detachably disposed on the base, the at least two supporting members being arranged in parallel; at least two probes supported by the at least two supporting members, respectively; and
    at least one partitioning member located between the at least two supporting members.

11. The battery cell formation device according to claim 10, wherein the at least one partitioning member is screwed to the base.

12. The battery cell formation device according to claim 10, wherein the number of the at least one partitioning member is multiple, and the partitioning members are located between the at least two supporting members.

13. The battery cell formation device according to claim 10, wherein the number of the at least two supporting members is multiple, the number of the at least one partitioning member is multiple, and the supporting members and the partitioning members are arranged in alternate manner.

14. The battery cell formation device according to claim 10, wherein the base comprises a frame and a rod disposed on the frame, and the rod passes through the at least two supporting members and the at least one partitioning member.

* * * * *